United States Patent [19]
Greaves

[11] Patent Number: 6,049,870
[45] Date of Patent: *Apr. 11, 2000

[54] SYSTEM AND METHOD FOR IDENTIFYING AND CONFIGURING MODULES WITHIN A DIGITAL ELECTRONIC DEVICE

[75] Inventor: Paul E. Greaves, Granite Bay, Calif.

[73] Assignee: Play, Inc., Rancho Cordova, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/832,529

[22] Filed: Apr. 3, 1997

Related U.S. Application Data

[63] Continuation-in-part of application No. 08/757,747, Nov. 26, 1996.

[51] Int. Cl.[7] .............................. G06F 9/445; G06F 13/00
[52] U.S. Cl. ............................... 713/1; 709/301; 710/104; 710/8; 710/10
[58] Field of Search ..................................... 395/114, 115, 395/651, 652, 284, 828, 830; 600/121, 123, 109; 348/7, 12, 13, 416, 10, 473, 722

[56] References Cited

U.S. PATENT DOCUMENTS

| | | | |
|---|---|---|---|
| 4,633,392 | 12/1986 | Vincent et al. | 364/200 |
| 5,303,342 | 4/1994 | Edge | 395/164 |
| 5,579,452 | 11/1996 | Ambalavanar et al. | 395/115 |
| 5,619,649 | 4/1997 | Kovnat et al. | 395/200.01 |
| 5,732,282 | 3/1998 | Provino et al. | 395/830 |
| 5,748,980 | 5/1998 | Lipe et al. | 395/828 |

*Primary Examiner*—Ayaz R. Sheikh
*Assistant Examiner*—Tim Vo
*Attorney, Agent, or Firm*—Carr & Ferrell LLP

[57] ABSTRACT

A system and method for identifying and configuring modules within a digital electronic device comprises a coordinator device coupled to the electronic device, functional modules coupled to the coordinator device for performing selected device functions, identifiers each uniquely associated with a corresponding one of the functional modules and configuration drivers which each correspond to one of the identifiers, whereby the coordinator may read the identifiers and execute the corresponding configuration drivers to configure the functional modules.

14 Claims, 7 Drawing Sheets

(Configuration Bus)

SYSTEM AND METHOD FOR IDENTIFYING AND CONFIGURING MODULES WITHIN A DIGITAL ELECTRONIC DEVICE

CROSS-REFERENCE TO RELATED APPLICATION

This application is a Continuation-In-Part of co-pending U.S. patent application Ser. No. 08/757,747, entitled "Real-Time Video Processing System," filed on Nov. 26, 1996, which subject matter is hereby incorporated by reference. This application and above cross-referenced patent application have been commonly assigned to Play, Incorporated of Rancho Cordova, Calif.

BACKGROUND OF THE INVENTION

1. Field of the Invention

This invention relates generally to digital electronic systems and more particularly to a system and method for identifying and configuring modules within a digital electronic device.

2. Description of the Background Art

Efficient and user-friendly operation is a significant consideration for manufacturers, designers and users of digital electronic systems. To allow easier implementation and use, many electronic systems are typically comprised of various modules or printed circuit boards which fit into corresponding module slots on a single motherboard device. The various modules may then advantageously communicate through a system bus network which connects the individual modules via a series of discrete electrically-conductive elements or wires.

To facilitate system efficiency and enhance proper operation, system designers have recently developed electronic systems having the capability to identify individual module types and their specific locations on the system motherboard. After identifying the different modules, the host systems may then advantageously configure or set up each module in accordance with the functionality of that particular module and the requirements of the host system. The configuration process thus renders the host system and its modules ready for proper and effective system operation.

Referring now to FIG. 1, a block diagram of a prior art system 110 for configuring a digital electronic device is shown. Prior art system 110 includes a coordinator 112 which communicates with a module 1 (114) through a module N (116) via system bus 118. In practice, module 1 (114) through module N (116) conventionally contain identification and configuration information encoded in hardware. Typical examples of configuration information might include the module operating speed, the amount of memory required by a particular module or specific module functions and parameters. Coordinator 112 may thus access the configuration information via system bus 118 to thereby set up and properly configure prior art system 110.

Encoding the identification and configuration information in hardware on module 1 (114) through module N (116) results in significant added cost and design complexity. Furthermore, encoding configuration information in hardware causes substantial difficulties when module 1 (114) through module N (116) must be updated or modified. The prior art system 110 described above thus presents significant drawbacks to electronics manufacturers as well as system users. Therefore, an improved system and method is needed for identifying and configuring modules within a digital electronic device, according to the present invention.

SUMMARY OF THE INVENTION

In accordance with the present invention, a system and method are disclosed for identifying and configuring modules within a digital electronic device. In the preferred embodiment of the present invention, a video processor device includes a coordinator which communicates with a series of functional modules via a main bus and also via a configuration bus. The video processor also communicates with a host computer via a system bus.

Each module in the video processor contains a unique module identifier. To configure a particular module, the coordinator reads the unique module identifier via the configuration bus and then supplies the module identifier to the host computer over the system bus. A configuration engine in the host computer memory then references special ID tables to locate the appropriate configuration driver which is also stored in the host computer memory.

Each configuration driver contains instructions which depend upon the type and vendor of the identified module. The configuration drivers may also contain configuration data needed by the selected module for correct operation of the video processor. Configuration data may include information such as memory required, module speed, module functionality or module operating parameters.

Once the appropriate configuration driver is located, the configuration engine executes the included instructions and, if appropriate, transmits any included configuration data to the coordinator via the system bus. The coordinator then stores the transmitted configuration data, via the configuration bus, into a configuration memory within the identified module.

After the configuration data is stored in the selected module, the coordinator also assigns a unique module address to the selected module via the main bus. Once the selected module has been identified, configured and assigned an address, then that module may begin to communicate with the coordinator and function in a normal manner. The remaining unconfigured modules of the video processor may likewise be configured using a similar process. In other embodiments, the configuration sequence may be altered somewhat. For example, the coordinator may read the identifiers from each board and then subsequently send the required configuration data to the modules.

In the preferred embodiment, the coordinator includes a main bus controller which coordinates operation of the main bus. The present invention may readily be utilized to identify and configure this main bus controller to thereby facilitate updating the functionality of the main bus in the event of hardware or software evolution.

The present invention permits saving configuration data in memory files on a host computer instead of encoding the configuration data in hardware on the individual modules. Furthermore, the present invention permits configuring the main bus through the use of a separate and distinct configuration bus. The present invention thus advantageously provides a more efficient system and method for identifying and configuring modules within a digital electronic device.

DETAILED DESCRIPTION OF THE PREFERRED EMBODIMENT

The present invention comprises a system and method for identifying and configuring modules within a digital electronic device, and includes a coordinator device coupled to the electronic device, functional modules coupled to the coordinator device for performing selected device functions, identifiers each uniquely associated with a corresponding one of the functional modules and configuration drivers which each correspond to one of the identifiers, so that the coordinator may read the identifiers and execute the corresponding configuration drivers to configure the functional modules.

Figure 1:
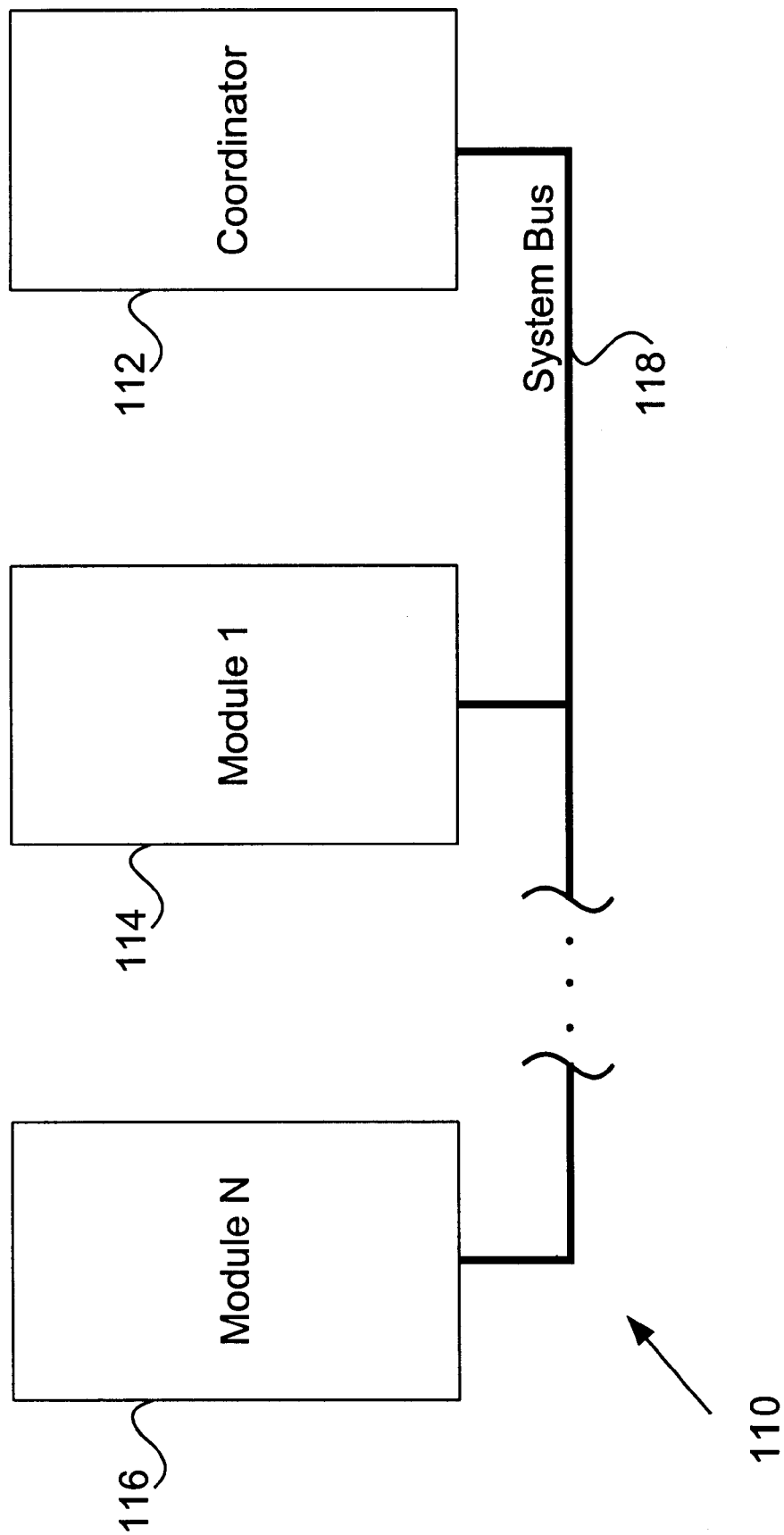
FIG. 1 is a block diagram of a prior art system for identifying modules and configuring a digital electronic device.
Figure 2:
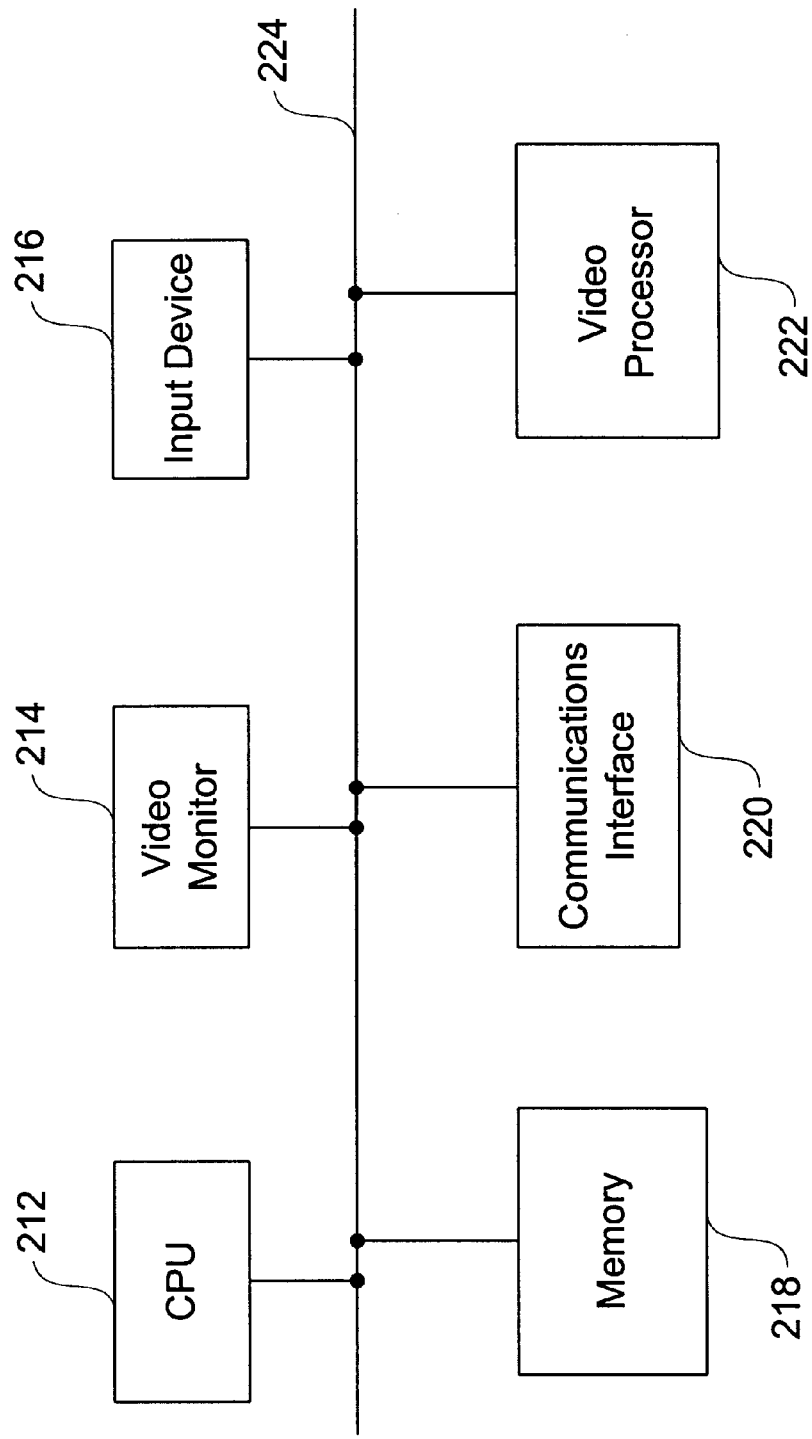
FIG. 2 is a block diagram of a computer system including a video processor, according to the present invention.

Referring now to FIG. 2, a computer 210 and a video processor 222 are shown according to the present invention. Computer 210 preferably comprises a central processing unit (CPU) 212, a video monitor 214, an input device 216, a memory 218 and a communications interface 220. Video processor 222 and each element of computer 210 are preferably coupled to a common system bus 224. Memory 218 may alternatively comprise various storage-device configurations, including Random-Access-Memory (RAM), Read-Only-Memory (ROM) and non-volatile storage devices such as floppy-disks or hard disk-drives. Video processor 222 receives, processes and outputs video information and is further discussed below in conjunction with FIGS. 3 through 8.

Figure 3:
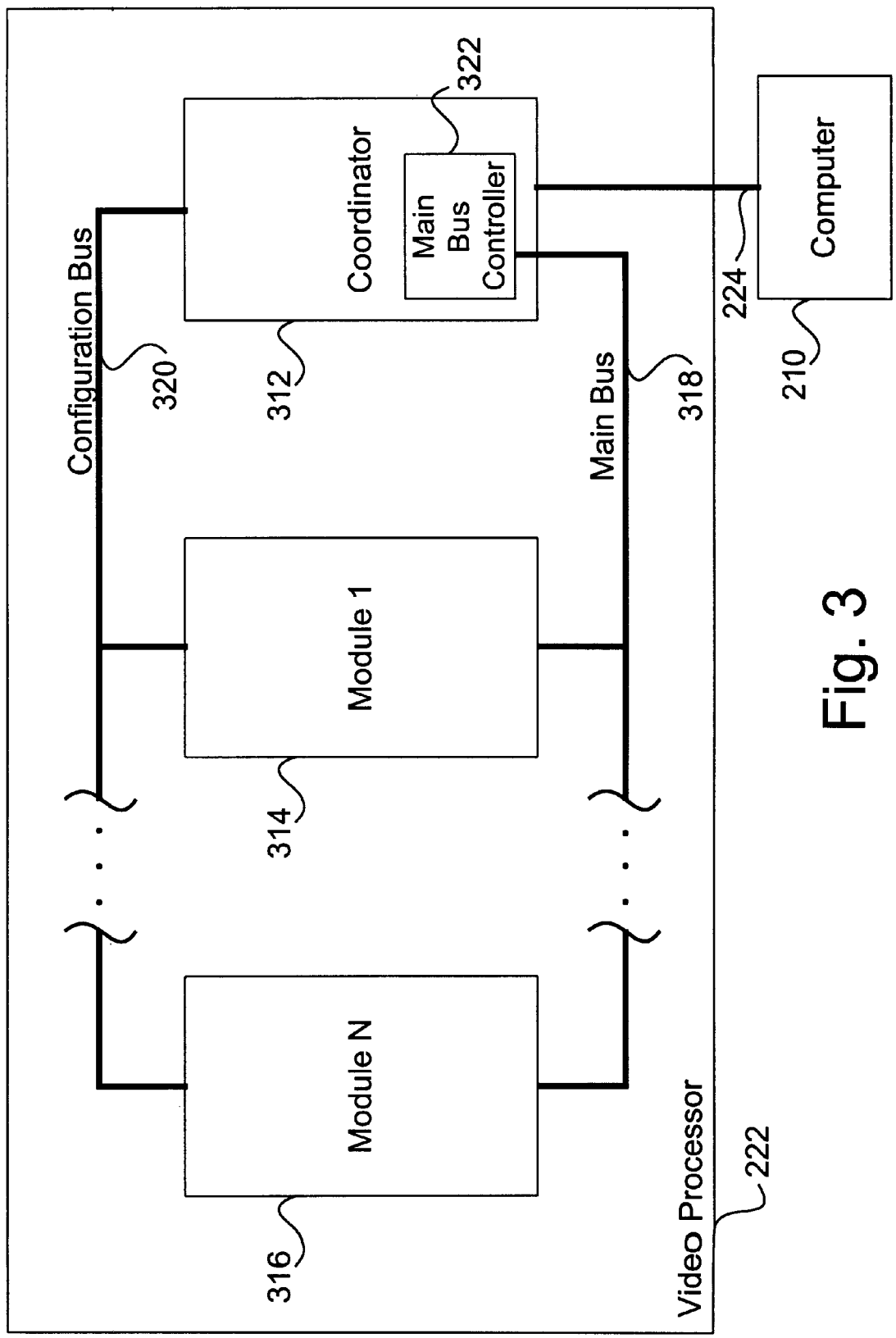
FIG. 3 is a block diagram of the video processor of FIG. 2, according to the present invention.

Referring now to FIG. 3, a block diagram of video processor 222 is shown. Video processor 222 includes a coordinator 312, a module 1 (314) through a module N (316), a main bus 318 and a configuration bus 320. Coordinator 312 controls the operation of video processor 222 and may include a microprocessor device and random-access memory. Coordinator 312 also preferably comprises a main bus controller 322 including a conventional field-programmable gate array device which may be programmed to control operation of main bus 318.

Coordinator 312 may advantageously be controlled by computer 210 via system bus 224. During normal operation, coordinator 312 communicates with module 1 (314) through module N (316) via main bus 318. During a module configuration mode, coordinator 312 may also communicate with module 1 (314) through module N (316) via configuration bus 320. Implementation and operation of configuration bus 320 during the module configuration mode is further described below in conjunction with FIGS. 4 through 8.

During the module configuration mode, coordinator 312 initially identifies module 1 (314) through module N (316) via configuration bus 320 and provides the module identity information to computer 210 via system bus 224. Computer 210 responsively provides configuration data to coordinator 312 which then utilizes the received configuration data to configure module 1 (314) through module N (316) via configuration bus 320. Finally, coordinator 312 assigns individual addresses to module 1 (314) through module N (316) to complete the module configuration process.

Figure 4:
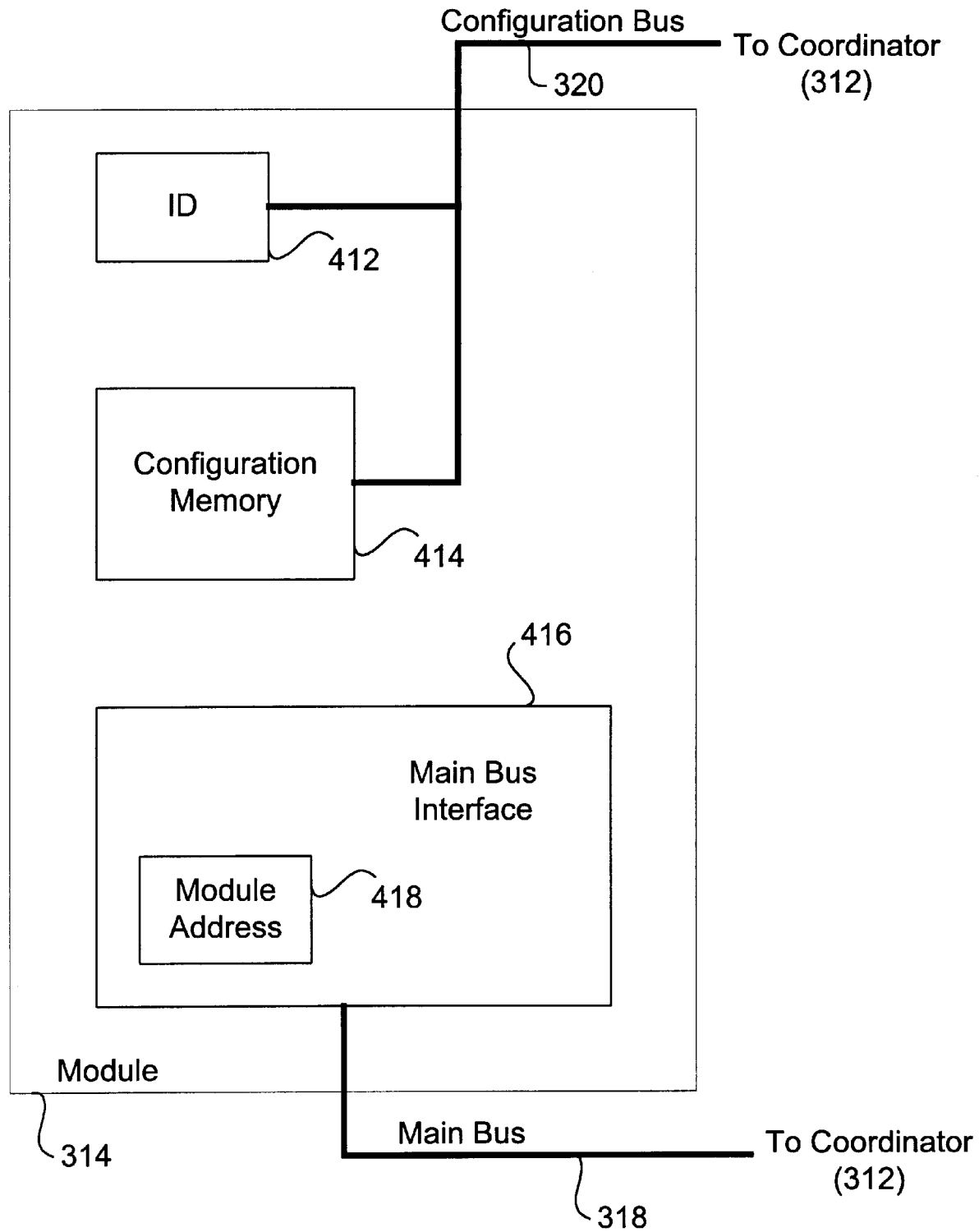
FIG. 4 is a block diagram of a module of FIG. 3, according to the present invention.

Referring now to FIG. 4, a block diagram of an exemplary module 314 is shown. As depicted in FIG. 3, video processor 222 typically comprises a number of discrete modules, depending on the functionality required by a particular system user. The structure and operation of module 314, as described below in conjunction with FIGS. 4 through 8, may therefore apply equally to any other modules located within video processor 222.

During the module configuration mode, coordinator 312 reads an identifier (ID) 412 from module 314 via configuration bus 320. In the preferred embodiment, ID 412 may be stored in a conventional programmable logic array (PLA) or alternately in a conventional shift register device. The PLA containing ID 412 may thus be programmed to emit a serial bit stream to form ID 412 which uniquely corresponds to the particular selected module 314. In the preferred embodiment, ID 412 is a 32 bit binary number in which the first eight bits are the module ID code, the second eight bits are the module vendor code and the last sixteen bits are unused, but are reserved for future increases in the total number of identifiers 412 required.

Coordinator 312 utilizes ID 412 to obtain configuration data from computer 210 and then provides the configuration data to configuration memory 414 via configuration bus 320. Configuration data typically includes information required for proper set up and operation of video processor 222 (for example, module operating speed, amount of memory required by a particular module or specific module functions and operating parameters). In the preferred embodiment, configuration memory 414 may be effectively implemented as a conventional field-programmable gate array (FPGA) with a serial interface that translates the configuration data from configuration bus 320 into signals suitable for programming the FPGA device.

Once configuration memory 414 stores the provided configuration data, then coordinator 312 sends a unique module address 418, via main bus 318, to a main bus interface 416 located on module 314. Module address 418 may be stored in a conventional register device on main bus interface 416. When module 314 receives and stores module address 418, then coordinator and module 314 are able to communicate and to function effectively through main bus 318.

Figure 5:
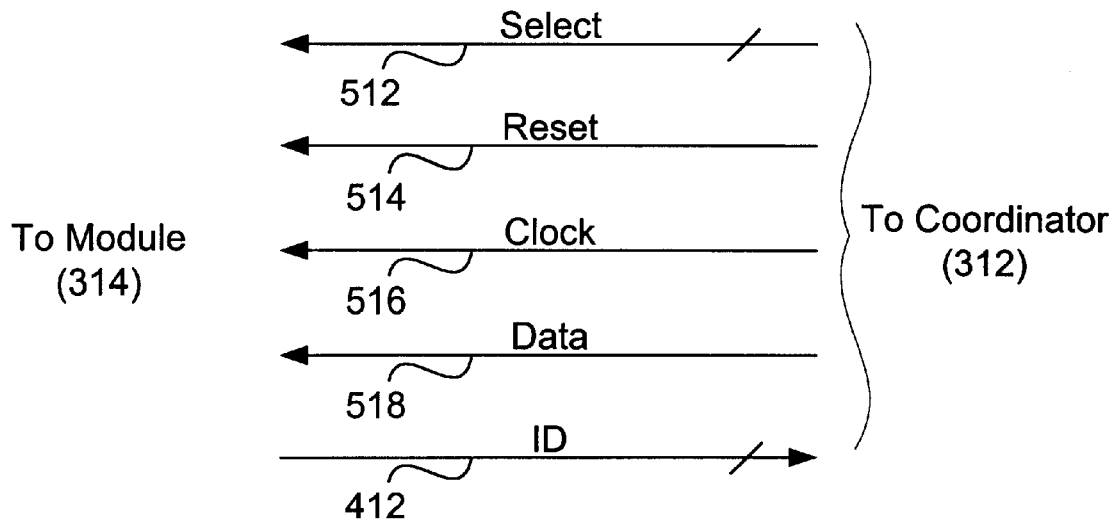
FIG. 5 is a schematic diagram of one embodiment for the configuration bus of FIG. 3.

Referring now to FIG. 5, a schematic diagram of one embodiment of configuration bus 320 is shown. Configuration bus 320 includes discrete select signals 512 to each module 1 (314) through module N (316), a common reset signal 514 to each module 1 (314) through module N (316), a common clock signal 516 to each module 1 (314) through module N (316), a common data signal 518 to each module 1 (314) through module N (316), and discrete ID signals 412 from each module 1 (314) through module N (316) to coordinator 312.

Coordinator 312 normally maintains select signal 512 at a digital "high" level. In practice, coordinator 312 may thus toggle select signal 512 to activate the remaining configuration bus 320 lines for the specific module 1 (314) through module N (316) to which coordinator 312 has transmitted select signal 512. In other words, when coordinator 312 toggles select signal 512 to a digital "low" level, the specifically-selected module 1 (314) through module N (316) may then accept information from reset signal 514, clock signal 516 or data signal 518, and may also transmit information from ID signal 412.

Reset signal 514 may be toggled to a digital "low" level to reset the circuit storing ID 412 to ensure that a valid ID 412 is present. Reset signal 514 also permits identifying a selected module 314 a second time. Additionally, coordinator 312 may simultaneously toggle reset signal 514, select signal 512 and data signal 518 to a digital "low" level to notify configuration memory 414 that reprogramming of the stored configuration data is about to occur.

Clock signal 516 is a separate digital pulse stream which is used to clock data signal 518 into configuration memory 414 and to clock ID 412 to coordinator 312. Data signal 518 provides configuration data to configuration memory 414 and in alternate embodiments may be bi-directional for also transmitting ID 412 to coordinator 312. The ID 412 line of FIG. 5 includes separate and individual lines from each module 1 (314) through module N (316) to coordinator 312 and is further described above in conjunction with FIG. 4. In alternate embodiments, ID 412 may be transmitted via other designated conductors, such as the interrupt line from main bus 318, in order to implement configuration bus 320 using a reduced number of individual bus lines.

Figure 6:
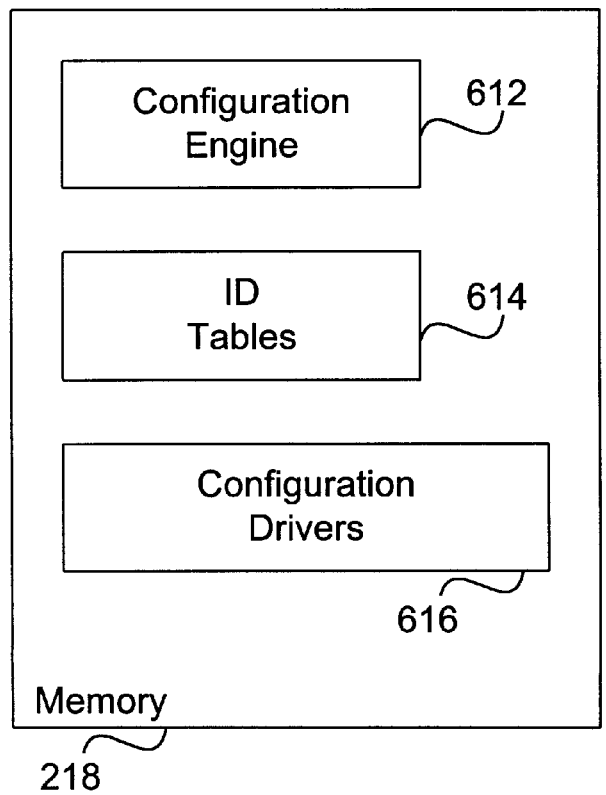
FIG. 6 is a block diagram of the memory of FIG. 2, according to the present invention.

Referring now to FIG. 6, a block diagram of memory 218 (FIG. 2) is shown. Memory 218 includes a configuration engine 612, ID tables 614 and configuration drivers 616. Configuration engine 612 is a software routine executed by CPU 212 (FIG. 2) to locate and run selected configuration drivers 616. In the preferred embodiment, coordinator 312 provides ID 412 to computer 210 via system bus 224. The configuration engine 612 then receives ID 412 and responsively references ID tables 614 to locate the appropriate configuration driver for the transmitted ID 412.

ID tables 614 contain a list of all possible IDs 412 and corresponding pointers to the appropriate specific drivers within configuration drivers 616. In practice, configuration engine 612 indexes the transmitted ID 412 to its corresponding pointer in ID tables 614 and then utilizes the indexed pointer to locate the appropriate driver within configuration drivers 616. Configuration engine 612 then executes the located driver and transmits the configuration data to coordinator 312 to thereby configure the module 314 selected within video processor 222.

Figure 7:
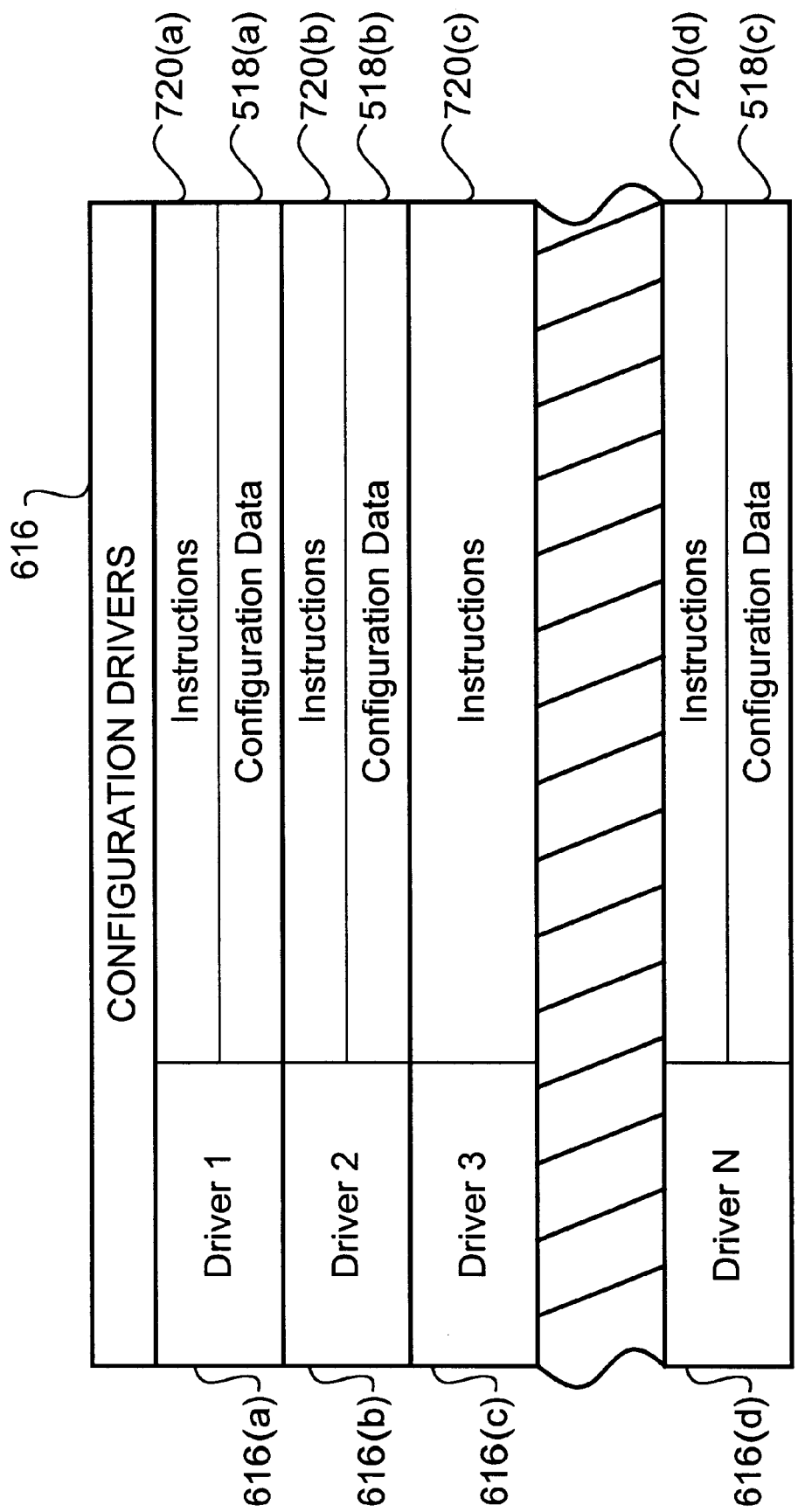
FIG. 7 is a block diagram of the configuration drivers of FIG. 6, according to the present invention.

Referring now to FIG. 7, a block diagram of one possible embodiment of configuration drivers 616 is shown. Configuration drivers 616 includes driver 1 (616(*a*)) through driver N (616(*d*)), each of which corresponds to a unique ID 412 listed in ID tables 614. Driver 1 (616(*a*)) through driver N (616(*d*)) each contain individual sets of instructions (720(*a*) through 720(*d*)) for configuring a corresponding identified module 1 (314) through module N (316). Furthermore, as illustrated in the FIG. 7 embodiment, driver 1 (616(*a*)), driver 2 (616(*b*)) and driver N (616(*d*)) each also contain configuration data (518(*a*) through 518(*c*)) corresponding to the particular identified module 1 (314) through module N (316). In contrast, driver 3 (616(*c*)) contains instructions 720(*c*) which do not direct configuration engine 612 to transmit any configuration data and therefore no data is stored in driver 3 (616(*c*)). Configuration engine 612 thus executes instructions 720 contained in the appropriate driver 1 (616(*a*) through 616(*d*)) and, if necessary, transmits the corresponding configuration data 518 to coordinator 312.

Figure 8:
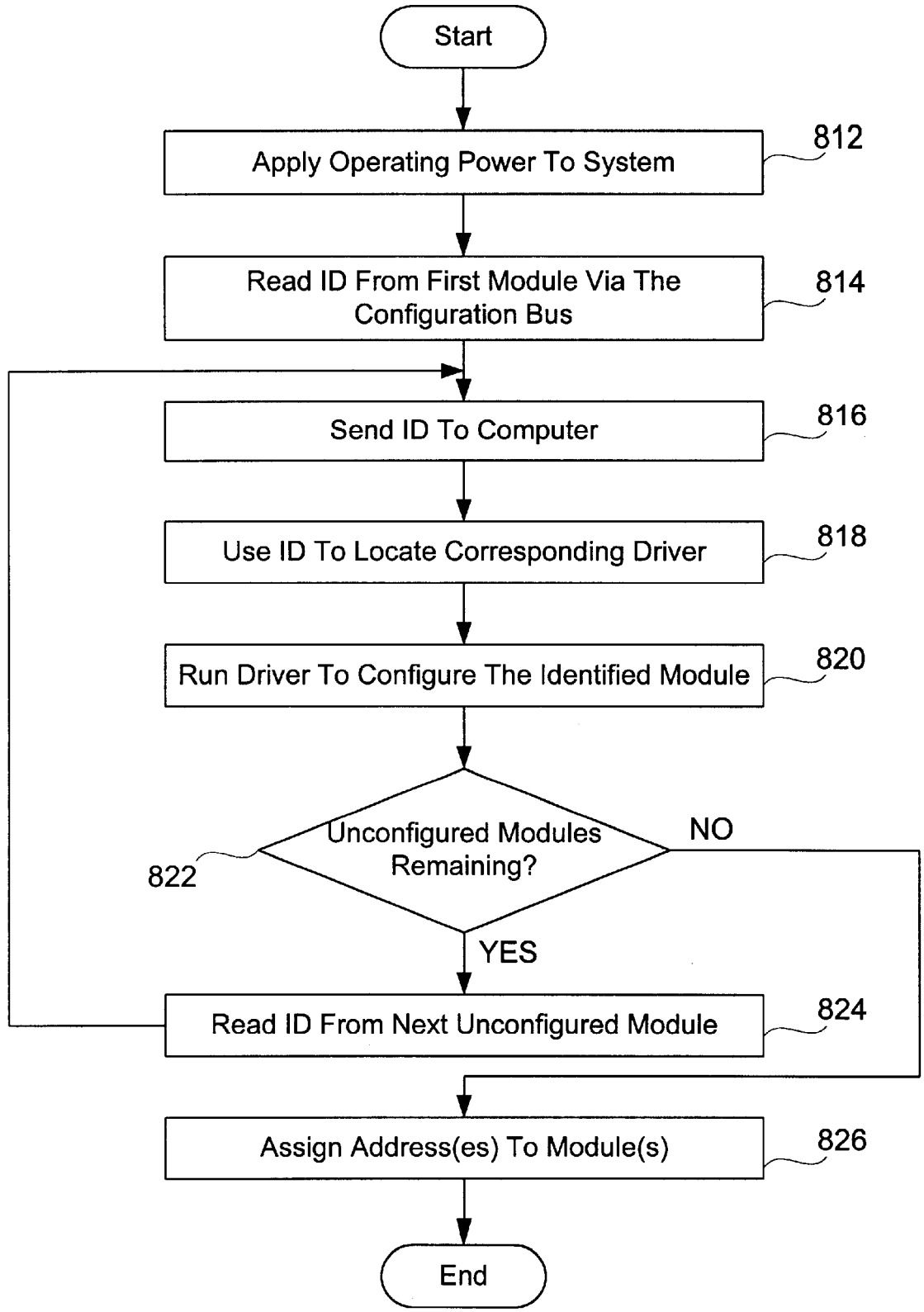
FIG. 8 is a flowchart of preferred method steps for identifying and configuring modules within a digital electronic device, according to the present invention.

Referring now to FIG. 8, a flowchart of preferred method steps for identifying and configuring module 1 (314) through module N (316) within video processor 222 (FIG. 3) is shown. Initially, a system user, in step 812, applies operating power to computer 210 and video processor 222. Events other than system powerup may also initiate the FIG. 8 process. For example, the above-described step 812 may alternately consists of various error conditions or other disruptive events occurring within computer 210 or video processor 222.

Next, in step 814, coordinator 312 reads D 412 from module 1 (314) via configuration bus 320. In the preferred embodiment, coordinator 312 first selects module 1 (314) by toggling select signal 512 on configuration bus 320, then resets ID 412 by toggling reset signal 514, and finally clocks ID 412 out of module 1 (314) using clock signal 516. In step 816, coordinator 312 receives the ID 412 on configuration bus 320 and responsively sends the received ID 412 to CPU 212 of computer 210 via system bus 224. Then, configuration engine 612, in step 818, uses transmitted ID 412 to locate the appropriate corresponding configuration driver 616. The use of ID tables 614 to locate the appropriate driver is 616 discussed above in conjunction with FIG. 6.

In step 820, configuration engine 612 then runs the instructions 720 in the located configuration driver 616 to configure the selected module 1 (314). If the located configuration driver 616 also contains related configuration data 518, then configuration engine 612 transmits the related configuration data 518 to coordinator 312 which stores the configuration data 518 into the configuration memory 414 of module 314 via configuration bus 320.

In the preferred embodiment, coordinator 312 first selects module 1 (314) by toggling select signal 512 on configuration bus 320 and then signals a reprogram of configuration memory 414 by also holding reset signal 514 and data signal 518 to a digital "low" level. After waiting a short period to allow module 1 (314) to prepare for a reprogram, coordinator 312 removes the digital "low" from reset signal 514 and clocks the transmitted configuration data 518 into configuration memory 414 using clock signal 516.

In step 822, coordinator 312 determines whether any of module 1 (314) through module N (316) remain unconfigured within video processor 222. If any of module 1 (314) through module N (316) remain unconfigured, then coordinator 312, in step 824, reads ID 412 from the next unconfigured module 1 (314) through module N (316). Coordinator 312 then repeats configuration steps 816 through 824 for each remaining unconfigured module 1 (314) through module N (316) until each module 1 (314) through module N (316) has been identified and configured.

In alternate embodiments, the FIG. 8 process steps 812 through 826 may be performed in various different sequences. For example, instead of identifying and configuring each module 1 (314) through module N (316) in a single sequence, coordinator 312 may perform the identifying steps 814 and 816 for each module 1 (314) through module N (316) and then subsequently perform the configuration steps 816 and 818 for each module 1 (314) through module N (316).

When each module 1 (314) through module N (316) has been identified and configured, coordinator 312, in step 826, assigns a unique module address 418 to each module 1 (314) through module N (316) and then the FIG. 8 process ends. For example, to assign an address to module 1 (314), coordinator 312 first toggles the select signal 512 corresponding to module 1 (314) to a digital "low" level to specifically select module 1 (314). Then coordinator 312 emits a "configuration cycle" command code on main bus 318. Concurrently, coordinator 312 transmits a unique module address 418 on main bus 318 to selected module 1 (314) which stores the unique module address 418 in main bus interface 416 to complete the module address 418 assignment.

In the preferred embodiment, the FIG. 8 process may also be used to advantageously identify and configure components of video processor 222 other than module 1 (314) through module N (316). For example, the present invention may contain means for reconfiguring main bus controller 322 within coordinator 312 (FIG. 3). Main bus controller 322 oversees the operation of main bus 318 and therefore the present invention may effectively program and configure the operation and functionality of main bus 318. This particular feature of the present invention is especially important for updating the functionality of main bus 318 in the event of hardware or software evolution.

The invention has been explained above with reference to a preferred embodiment. Other embodiments will be apparent to those skilled in the art in light of this disclosure. For example, the present invention may readily identify and configure modules and systems other that those described in the preferred embodiment above. Therefore, these and other variations upon the preferred embodiments are intended to be covered by the present invention, which is limited only by the appended claims.

What is claimed is:

1. An electronic device, coupleable to a host computer and physically separate therefrom, comprising:

a coordinator for managing communications within the electronic device and between the electronic device and the host computer, the coordinator being connected to a main bus through a main bus controller physically included in the coordinator and being separately connected to a configuration bus;

at least one module for performing selected device functions, the at least one module being connected to the main bus through a main bus interface and being separately connected to the configuration bus, the module having a unique identifier and configuration memory accessible by the configuration bus;

wherein the coordinator is operative to retrieve the identifier of the at least one module via the configuration bus, to send the identifier to the host computer via a system bus, to receive from the host computer configuration data corresponding to the identifier, and to send the configuration data via the configuration bus to the at least one module for storage in the configuration memory thereof.

2. The electronic device of claim 1, wherein the configuration bus includes select signals, a reset signal, a clock signal, a configuration data signal and identifier signals.

3. The electronic device of claim 1, wherein the main bus controller is operative to configure the main bus based on the received configuration data for subsequent communication over the main bus between the coordinator and the at least one module.

4. The electronic device of claim 1, wherein the coordinator assigns a unique module address to the at least one module after configuring the at least one module.

5. The electronic device of claim 4, wherein the coordinator and the at least one module communicate via the main bus after the unique module address is received by the main bus interface of the at least one module.

6. A method for configuring an electronic device, comprising the steps of:

providing a coordinator for managing communications within the electronic device, the coordinator being connected to a main bus through a main bus controller physically included in the coordinator and being separately connected to a configuration bus;

providing at least one module for performing selected device functions, the at least one module being connected to the main bus through a main bus interface and being separately connected to the configuration bus, the module having a unique identifier and configuration memory accessible by the configuration bus;

retrieving the identifier of the at least one module via the configuration bus;

locating configuration data corresponding to the identifier; and sending the configuration data via the configuration bus to the at least one module for storage in the configuration memory thereof.

7. The method of claim 6, wherein the step of locating configuration data further comprises the steps of:

transmitting the identifier to a host computer over a system bus;

at the host computer, retrieving configuration data corresponding to the identifier;

transmitting the configuration data from the host computer to the coordinator over the system bus.

8. The method of claim 6, further comprising the step of using the main bus controller to configure the main bus for subsequent communication between the controller and the at least one module.

9. The method of claim 6, further comprising the step of assigning a unique memory address to the at least one module after sending the configuration data to the at least one module.

10. A computer system, comprising:

a host computer storing configuration data;

an electronic device, physically separate from the host computer and coupled thereto by a system bus, the electronic device including a coordinator for managing communications within the electronic device and between the electronic device and the host computer and at least one module for performing selected device functions;

the coordinator being connected to a main bus through a main bus controller physically included in the coordinator and being separately connected to a configuration bus, and the at least one module being connected to the main bus through a main bus interface and being separately connected to the configuration bus, the module having a unique identifier and configuration memory accessible by the configuration bus;

wherein the coordinator is operative to retrieve the identifier of the at least one module via the configuration bus, to send the identifier to the host computer via a system bus, to receive from the host computer configuration data corresponding to the identifier, and to send the configuration data via the configuration bus to the at least one module for storage in the configuration memory thereof.

11. The computer system of claim 10, wherein the configuration bus includes select signals, a reset signal, a clock signal, a configuration data signal and identifier signals.

12. The computer system of claim 10, wherein the main bus controller is operative to configure the main bus based on the received configuration data for subsequent communication over the main bus between the coordinator and the at least one module.

13. The computer system of claim 10, wherein the coordinator assigns a unique module address to the at least one module after configuring the at least one module.

14. The computer system of claim 13, wherein the coordinator and the at least one module communicate via the main bus after the unique module address is received by the main bus interface of the at least one module.

* * * * *